(12) United States Patent
Su et al.

(10) Patent No.: US 10,540,866 B2
(45) Date of Patent: Jan. 21, 2020

(54) DOOR SWITCH

(71) Applicant: OMRON Corporation, Kyoto (JP)

(72) Inventors: Rina Su, Moriyama (JP); Keishi Yayama, Ritto (JP); Kazuhiro Kudo, Kusatsu (JP)

(73) Assignee: OMRON Corporation, Kyoto (JP)

(*) Notice: Subject to any disclaimer, the term of this patent is extended or adjusted under 35 U.S.C. 154(b) by 0 days.

(21) Appl. No.: 16/190,163

(22) Filed: Nov. 14, 2018

(65) Prior Publication Data
US 2019/0244490 A1  Aug. 8, 2019

(30) Foreign Application Priority Data
Feb. 7, 2018 (JP) ................................. 2018-019987

(51) Int. Cl.
| G08B 5/36 | (2006.01) |
| F21V 8/00 | (2006.01) |
| F21V 13/02 | (2006.01) |
| F21V 7/00 | (2006.01) |
| F21Y 113/13 | (2016.01) |
| F21Y 115/10 | (2016.01) |

(52) U.S. Cl.
CPC .............. *G08B 5/36* (2013.01); *F21V 7/0091* (2013.01); *F21V 13/02* (2013.01); *G02B 6/0001* (2013.01);
(Continued)

(58) Field of Classification Search
CPC ...... G08B 21/18; G08B 21/24; G08B 21/182; G08B 21/22; G08B 13/1427; G08B 21/02;
(Continued)

(56) References Cited

U.S. PATENT DOCUMENTS

| 7,819,442 B2 * | 10/2010 | Ieda ..................... B60R 25/24 292/336.3 |
| 2010/0188838 A1 | 7/2010 | Yajima et al. |
| 2019/0024421 A1 * | 1/2019 | Cumbo ................ B60Q 1/2669 |

FOREIGN PATENT DOCUMENTS

| EP | 2085800 | 8/2009 |
| EP | 2728316 | 5/2014 |

(Continued)

OTHER PUBLICATIONS

"Search Report of Europe Counterpart Application", dated May 14, 2019, p. 1-p. 9.
(Continued)

*Primary Examiner* — Mark S Blouin
(74) *Attorney, Agent, or Firm* — JCIPRNET

(57) ABSTRACT

The door switch (1) includes an actuator (20) and a sensor (10). When a door is closed, a front surface (S1) of the sensor (10) and an opposite surface of the actuator (20) are in contact with each other, and separated when the door is open. The sensor (10) includes a light source part (150) for emitting detection light according to a reception state of a detection signal outputted from the actuator, a collector (122) for collecting the detection light, a diffuse light guide part (123) formed to be connected to the collector and for diffusing and emitting the detection light collected by the collector, and a back surface display part (121) formed on a back surface (B1) side of the sensor to be in contact with the diffuse light guide part and having a main surface (125) for emitting the detection light emitted from the diffuse light guide part.

6 Claims, 6 Drawing Sheets

(52) U.S. Cl.
CPC ........ *F21Y 2113/13* (2016.08); *F21Y 2115/10* (2016.08)

(58) Field of Classification Search
CPC ................ G08B 25/10; G08B 21/0247; G08B 21/0277; G08B 3/10
USPC ...................................................... 340/686.6
See application file for complete search history.

(56) References Cited

FOREIGN PATENT DOCUMENTS

| | | |
|---|---|---|
| EP | 2873912 | 5/2015 |
| JP | H0668257 | 9/1994 |
| JP | 2003045266 | 2/2003 |
| JP | 2012002968 | 1/2012 |
| KR | 1010030570000 | 12/2010 |

OTHER PUBLICATIONS

Zipato, "Door/Window Sensor," Jun. 2015, p. 1, <https://www.zipato.com/wp-content/uploads/2015/07/vs-zd2102-Zipato-DoorWindow-Sensor-Data-Sheet.pdf>.

Omron Switch Catalog, "D40A/G9SX-NS: Electronic Detection Mechanism for Better Stability in Non-contact Door Switch Operation," Jan. 6, 2014, Retrieved: http://www.ia.omron.com/products/family/1832/.

"Office Action of Korea Counterpart Application," dated Sep. 24, 2019, with English translation thereof, p. 1-p. 8.

\* cited by examiner

DOOR SWITCH

CROSS REFERENCE TO RELATED APPLICATION

The disclosure claims priority under 35 U.S.C. § 119 to Japanese Application No. 2018-019987 filed Feb. 7, 2018, the entire content of which is incorporated herein by reference.

BACKGROUND

Technical Field

The disclosure relates to a structure for improving visibility of a compact door switch having a light emitting function.

Description of Related Art

In a configuration disclosed in Patent Document 1, a light source, convex lenses, and concave lenses are used to allow a display surface to emit light uniformly, thereby improving visibility.

In a configuration disclosed in Patent Document 2, the visibility is improved by causing operation keys disposed on an operation surface to emit light without using light sources separately.

RELATED ART

Patent Document

[Patent Document 1] Japanese Laid-open No. 2012-2968
[Patent Document 2] Japanese Laid-open No. 2003-45266

Technical Problem

However, in the case of using the configuration of Patent Document 1, since a plurality of lenses are included, the distance from the light source to the display surface is increased, and it is difficult to make the door switch compact.

Further, in the case of using the configuration of Patent Document 2, only the operation keys, i.e. only the parts to be operated, are caused to partially emit light, so it is difficult to cause the entire operation surface to emit light over a wide range.

Therefore, the disclosure provides a structure for improving visibility of a compact door switch having a light emitting function.

SUMMARY

The door switch includes an actuator and a sensor. The door switch is installed so that, when a door is closed, a front surface of the sensor and an opposite surface of the actuator are in contact with or close to each other, and when the door is open, the front surface of the sensor and the opposite surface of the actuator are separated from each other.

Further, the sensor includes a light source part for emitting detection light according to a reception state of a detection signal outputted from the actuator or according to a state of the sensor; a collector for collecting the detection light; a diffuse light guide part formed to be connected to the collector and for transmitting, diffusing and emitting the detection light collected by the collector; and a back surface display part formed on a back surface side of the sensor to be in contact with the diffuse light guide part and having a main surface for emitting in a planar shape the detection light emitted from the diffuse light guide part.

DESCRIPTION OF THE EMBODIMENTS

Applicable Example

Figure 1:
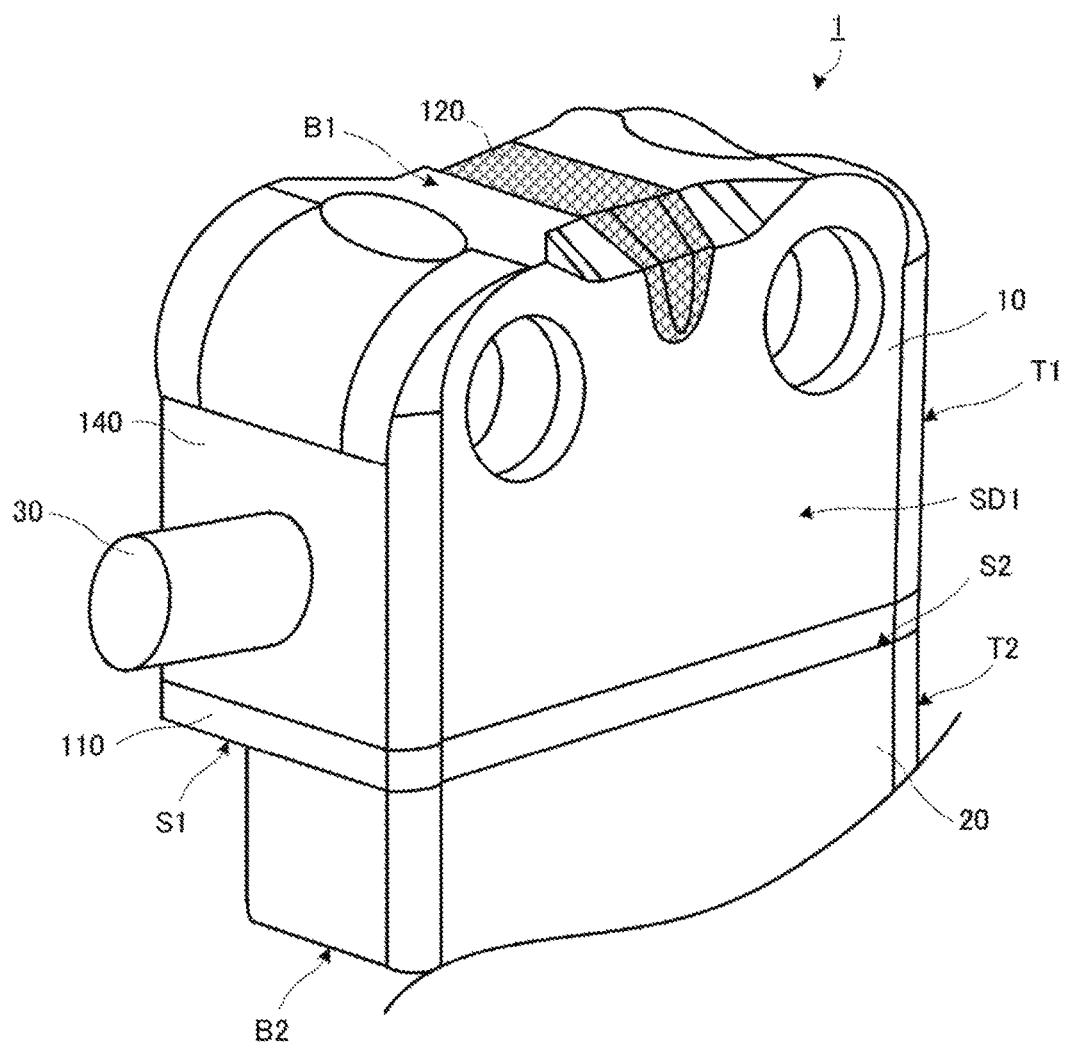
FIG. 1 is a perspective view of a door switch according to the first embodiment of the disclosure.

First, an example to which the disclosure is applied will be described with reference to FIG. 1. FIG. 1 is a schematic view of a door switch according to the first embodiment. In addition, in FIG. 1, a light guide display part 120 is hatched to make it easier to understand where detection light is emitted.

As shown in FIG. 1, the door switch 1 includes a sensor 10 and an actuator 20. A wiring part 30 is connected to the sensor 10 and transmits a signal received by the sensor 10 to other devices. The wiring part 30 is, for example, a connector, a cable or the like.

First, a configuration of the sensor 10 will be described. The sensor 10 is formed with a display part 110, the light guide display part 120, and a sensor housing 140. The sensor 10 is formed with a front surface S1, a back surface B1 and side surfaces SD1 connecting the front surface S1 and the back surface B1.

In addition, among the side surfaces connecting the front surface S1 and the back surface B1, a surface opposite to a surface connected with the wiring part 30 is defined as a top surface T1.

The display part 110 is formed on the front surface S1 of the sensor housing 140. The light guide display part 120 is formed at a position corresponding to the approximate center of the back surface B1 of the sensor housing 140 and is formed so as to overlap a part of the side surface SD1.

Next, a configuration of the actuator 20 will be described. The actuator 20 is formed with a front surface S2, a back surface B2 and side surfaces connecting the front surface S2 and the back surface B2. The front surface S2 of the actuator 20 is the "opposite surface of the actuator" in the disclosure.

In addition, among the side surfaces connecting the front surface S2 and the back surface B2, a surface on the side of the top surface T1 of the sensor 10 is defined as a top surface T2.

More specifically, an example of the relationship between the sensor 10 and the actuator 20 will be described below.

The sensor 10 includes a substrate therein. The substrate has an RFID (Radio Frequency Identification) antenna (not shown). In addition, the actuator 20 includes a passive IC tag (Passive Integrated Circuit Tag) (not shown) therein.

The RFID antenna transmits radio waves to the passive IC tag and receives radio waves from the passive IC tag. In this way, an opposite state between the sensor 10 and the actuator 20 can be obtained.

In addition, although passive RFID is shown as an example, active RFID may be used instead. In addition, although RFID is shown as an example, the embodiments are not limited to RFID, and any configuration that can obtain the opposite state may be used.

Further, the substrate included in the sensor 10 includes a light source. In FIG. 1, illustrations of the substrate and the light source are omitted. The light source emits detection light according to the opposite state of the door switch 1 or a state of the sensor 10. The state of the sensor 10 is, for example, a state in which an error of the sensor 10 is detected or a case in which a short circuit is detected, or the like. As for light emitting patterns, for example, in a state where a door is open, the light source emits red light, and to show a state where the door is closed, the light source emits green light, and to show an abnormal state of the sensor 10, the light source emits yellow light.

The light guide display part 120 guides the detection light while diffusing the detection light and emits the detection light from the back surface B1 of the sensor 10 substantially uniformly in a planar shape.

In this way, the opposite state of the door switch 1 can be easily recognized according to a light emitting state of the light guide display part 120, thereby improving the visibility. As a result, the open or closed state of the door can be reliably visually recognized even from the back surface. In addition, since the light guide display part 120 is formed on at least a part of the side surface SD1, the visibility is further improved, and the open or closed state of the door can be reliably visually recognized even from the side surface.

Configuration Example 1

Figure 2:
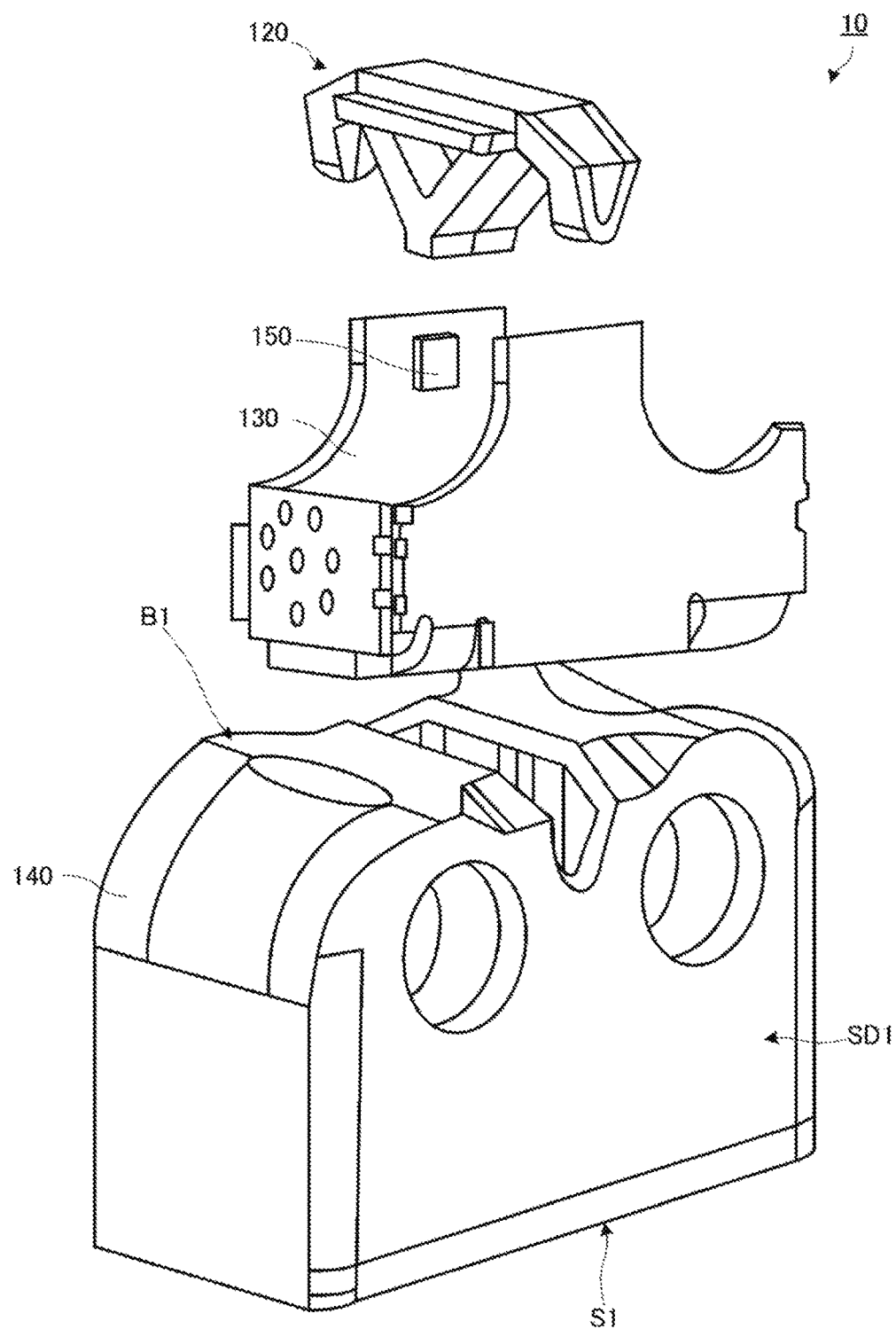
FIG. 2 is an exploded view of a sensor according to the first embodiment of the disclosure.
Figure 3:
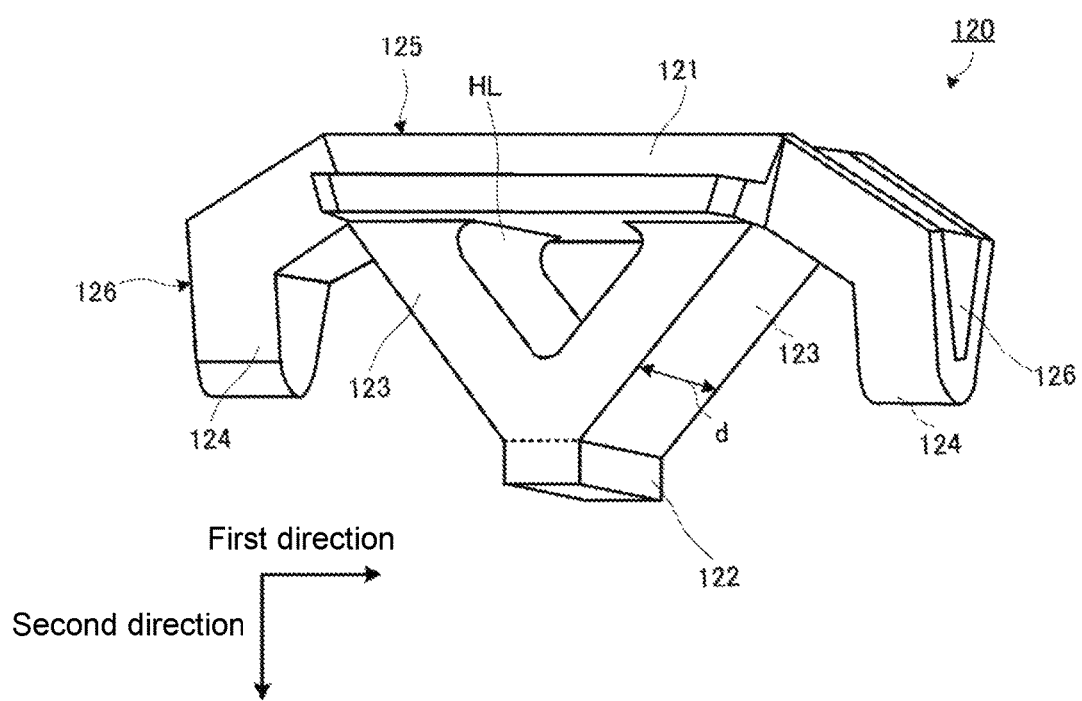
FIG. 3 is a schematic view of a light guide display part which is a part of the sensor according to the first embodiment of the disclosure.
Figure 4:
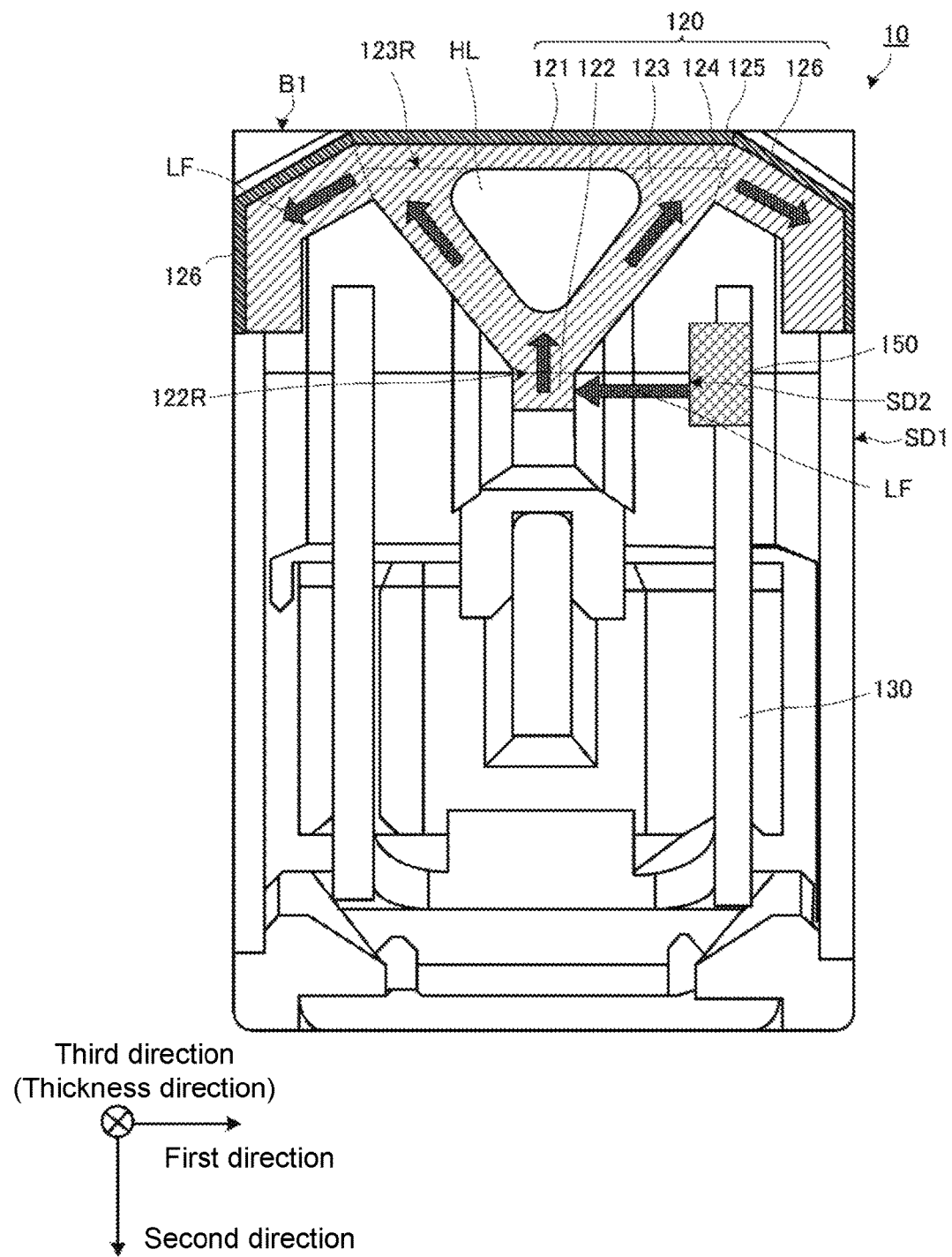
FIG. 4 is a cross-sectional side view of the sensor according to the first embodiment of the disclosure.

As described above, FIG. 1 is a perspective view of the door switch according to the first embodiment of the disclosure. FIG. 2 is an exploded view of the sensor according to the first embodiment of the disclosure. FIG. 3 is a schematic view of the light guide display part which is a part of the sensor according to the first embodiment of the disclosure. FIG. 4 is a cross-sectional side view of the sensor according to the first embodiment of the disclosure.

A specific configuration example will be described with reference to FIG. 2 based on the functional configuration of FIG. 1 described above. FIG. 2 is an exploded view showing a configuration of a part of the sensor 10. In FIG. 2, only the main part of the sensor 10 is shown, and a part of the configuration is omitted.

The sensor 10 is formed with the light guide display part 120, a substrate 130, and the sensor housing 140. In addition, the light guide display part 120 and the substrate 130 are formed to be in contact with each other. More specifically, the sensor housing 140 covers the substrate 130. In other words, the light guide display part 120 is disposed so as to be fitted into the sensor housing 140 and the substrate 130 when viewed from the side of the back surface B1.

A more specific shape and configuration of the light guide display part 120 will be described with reference to FIG. 3. The light guide display part 120 includes a back surface display part 121, a collector 122, a diffuse light guide part 123, side surface display parts 124, a main surface 125, and secondary surfaces 126.

A direction parallel to the back surface B1 of the sensor 10 and the back surface display part 121 formed on a part of the back surface B1 and parallel to a longitudinal direction of the back surface display part 121 is defined as a first direction. In addition, a direction orthogonal to the back surface B1 of the sensor 10 and the back surface display part 121 formed on a part of the back surface B1 is defined as a second direction. The back surface display part 121 is formed to be parallel to the collector 122. That is, the back surface display part 121 and the collector 122 include surfaces parallel to the first direction.

In addition, the first direction is the "longitudinal direction" in the disclosure. In addition, a direction orthogonal to a plane including the first direction and the second direction is a third direction. In other words, the third direction is a thickness direction of the light guide display part 120.

The back surface display part 121 is connected to the diffuse light guide part 123. The back surface display part 121 is connected to the side surface display parts 124. In addition, the collector 122 is connected to the diffuse light guide part 123.

A specific shape of the diffuse light guide part 123 will be described. The diffuse light guide part 123 has a shape that two parts thereof are extending separately in a predetermined angle with the collector 122 as a reference point, that is, the diffuse light guide part 123 has a V-shape. Further, the diffuse light guide part 123 on one side and the diffuse light guide part 123 on the other side have the same shape and are in contact with the collector 122 in the valley part of the V-shape.

The back surface display part 121 is formed on the side opposite to the collector 122 with the diffuse light guide parts 123 interposed therebetween in the second direction. In other words, the back surface display part 121 is formed so as to connect the two diffuse light guide parts 123. In other words, a substantial triangle is formed with the two diffuse light guide parts 123 and the back surface display part 121 as three sides, and the triangle has a shape with a space HL therein. In addition, the side surface display parts 124 are formed so as to be in contact with the diffuse light guide parts 123 respectively.

The main surface 125 is a surface of the back surface display part 121 opposite to the diffuse light guide part 123. In addition, the secondary surfaces 126 are surfaces of the side surface display parts 124 connected to both sides of the main surface 125 and extending to the second direction side.

In addition, the light guide display part 120 has a shape with a thickness d in the third direction orthogonal to the plane formed in the first direction (longitudinal direction) and the second direction. It is preferable that the thickness d remains the same throughout the light guide display part 120. The thickness d may be any thickness that allows the detection light to be guided and the main surface 125 (the back surface display part 121) and the secondary surfaces 126 (the side surface display parts 124) to have uniform brightness. Details will be described below.

In addition, it is preferable that the light guide display part 120 has a shape that is bilateral-symmetrical in the first direction. The light guide display part 120 is not limited to the V-shape and may be a Y-shape. In other words, when the light guide display part 120 is viewed from the third direction (the thickness direction), the part on the left side and the part on the right side of the center in the first direction, i.e., the longitudinal direction, form a symmetrical shape.

With the light guide display part 120 in a symmetrical shape, the brightness of the main surface 125 on the back surface display part 121 and the secondary surfaces 126 on the side surface display parts 124 can be made substantially uniform, and spots (unevenness) can be reduced.

The back surface display part 121, the collector 122, the diffuse light guide parts 123, the side surface display parts 124, the main surface 125 and the secondary surfaces 126 are made of a transparent or translucent material and may use a resin, for example, as the material. Therefore, they can be manufactured easily and at a low cost.

In addition, the light guide display part 120 may be integrally formed. By integrally forming the light guide display part 120, reflection or the like at an interface is reduced, and light guide efficiency is improved.

A structure of the light guide display part 120 when disposed in the sensor 10 and a method of guiding the detection light will be described with reference to the cross-sectional side view of FIG. 4. In FIG. 4, in order to make the description easy to understand, a part of the structure is shown in exaggeration.

The substrate 130 is disposed inside the sensor 10. A light source 150 is formed on the substrate 130. The light source 150 is, for example, a light emitting diode (LED).

The light source 150 has a light emitting surface SD2. The light source 150 is formed at a position opposite to the collector 122. At this time, the light emitting surface SD2 of the light source 150 is opposite to the collector 122 of the light guide display part 120.

As described above, the light source 150 emits the detection light LF according to the opposite state of the door switch 1. The detection light LF is emitted from the light emitting surface SD2 and enters the collector 122. The collector 122 guides the detection light LF to the diffuse light guide part 123. The diffuse light guide part 123 guides the detection light LF to the back surface display part 121 and the main surface 125 while diffusing the detection light LF in the diffuse light guide part 123. Similarly, the diffuse light guide part 123 guides the detection light LF to the side surface display parts 124 and the secondary surfaces 126.

The cross-sectional area of the collector 122 is defined as the cross-sectional area 122R, and the cross-sectional area of the diffuse light guide part 123 at the side in contact with or close to the back surface display part 121 is defined as the cross-sectional area 123R. At this time, for example, the thickness d of the light guide display part 120 is adjusted and determined so as to have a relationship of the cross-sectional area 123R>the cross-sectional area 122R.

By setting the cross-sectional area 123R of the diffuse light guide part 123 to be larger than the cross-sectional area 122R of the collector 122, the light collected by the collector 122 can be diffused. Therefore, the detection light LF is emitted from the light source 150 and is guided from the collector 122 to the main surface 125 on the back surface display part 121 and to the secondary surfaces 126 on the side surface display parts 124 while being diffused inside the diffuse light guide parts 123 and inside the side surface display parts 124.

Therefore, even when the light source 150 is a point light source, the brightness of the main surface 125 in contact with the planar back surface display part 121 and the brightness of the secondary surfaces 126 in contact with the side surface display parts 124 can be made substantially uniform, and unevenness can be reduced.

As described above, the light guide display part 120 can guide the detection light LF with good efficiency by using the internal reflection inside the light guide display part 120. In addition, since the resin is a material that reduces the leakage of the detection light LF, the detection light LF can be efficiently guided.

Further, since a part of the collector 122 is formed of a material having a low light transmittance, the collector 122 can reduce the case where the detection light LF traveling straight is guided to parts other than the diffuse light guide part 123.

By using such a configuration of the sensor 10, even when the light source 150 is a point light source such as an LED, the detection light LF can be guided over a wide range. That is, the brightness of the main surface 125 and the secondary surfaces 126 can be made substantially uniform, and unevenness can be reduced. As a result, the open or closed state of the door can be reliably visually recognized. Therefore, the visibility of the sensor 10 (the door switch 1) is improved.

As a result, the main surface 125 in contact with the back surface display part 121 and the secondary surfaces 126 in contact with the side surface display parts 124 can display the state of the detection light LF obtained from the opposite state of the door switch 1. In addition, since the light source 150 is an LED, the space for disposing the light source 150 can be reduced, and the sensor 10 (the door switch 1) can be made compact.

Configuration Example 2

Figure 5:
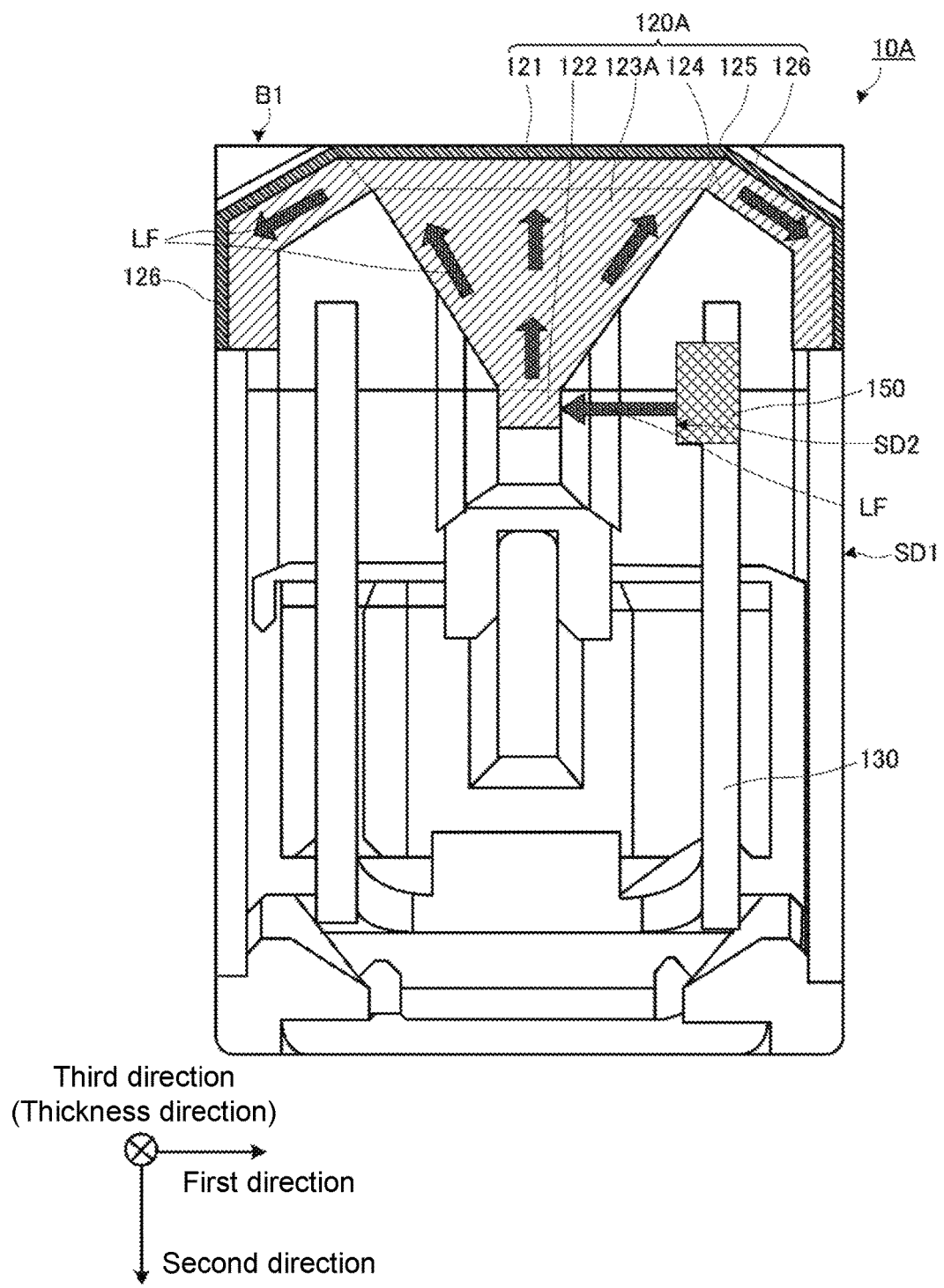
FIG. 5 is a cross-sectional side view of a sensor according to the second embodiment of the disclosure.

Next, an overview of a door switch according to the second embodiment will be described with reference to FIG. 5. FIG. 5 is a cross-sectional side view of the sensor according to the second embodiment of the disclosure.

The second embodiment differs from the first embodiment in the shape of a diffuse light guide part 123A. The other points are the same as those of the first embodiment, and descriptions of the same places are omitted.

Compared with the diffuse light guide part 123 in the first embodiment, the diffuse light guide part 123A does not have the space HL formed therein.

In the present embodiment, it is also preferable that the light guide display part 120A has a shape that is bilateral-symmetrical in the first direction.

With such a configuration, the diffuse light guide part 123A can guide the detection light LF that enters from the collector 122 with good efficiency, can make the brightness of the main surface 125 and the secondary surfaces 126 substantially uniform and can reduce unevenness.

Further, since the brightness of the main surface 125 on the back surface display part 121 and the brightness of the secondary surfaces 126 on the side surface display parts 124 can be made substantially uniform and unevenness can be reduced, the open or closed state of the door can be reliably visually recognized. Therefore, the visibility of the sensor 10A (the door switch) is improved.

Furthermore, as in the first embodiment, since the light source 150 is a light emitting diode (LED), the space for disposing the light source 150 can be reduced, and the sensor 10A (the door switch) can be made compact.

Configuration Example 3

Figure 6:
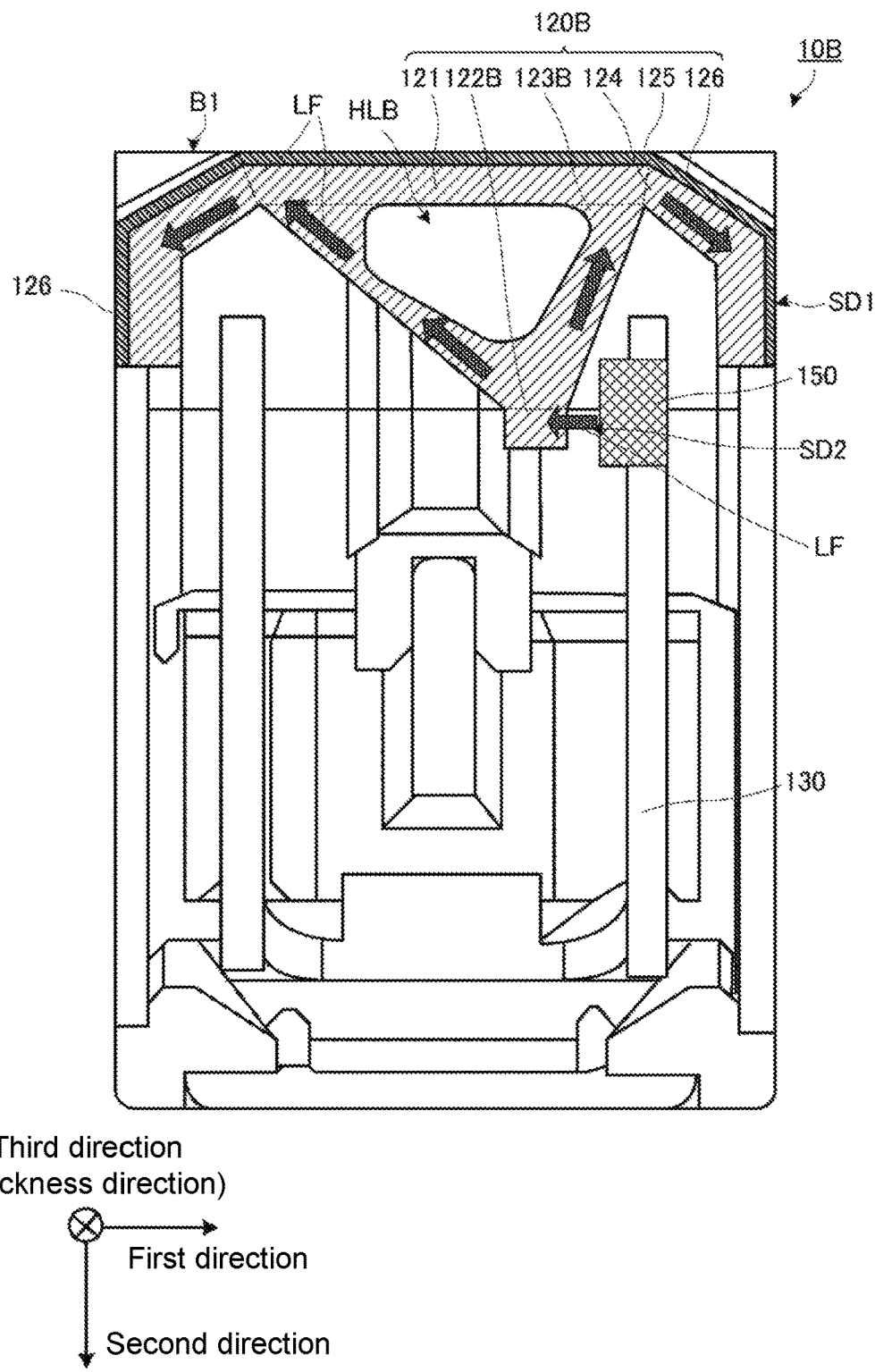
FIG. 6 is a cross-sectional side view of a sensor according to the third embodiment of the disclosure.

Next, an overview of a door switch according to the third embodiment will be described with reference to FIG. 6. FIG. 6 is a cross-sectional side view of the sensor according to the third embodiment of the disclosure.

The light guide display part 120B of the third embodiment differs from the first embodiment in the shape of a diffuse light guide part 123B, the shape of a space HLB, and the formation position of a collector 122B. The other points are the same as those of the first embodiment, and descriptions of the same places are omitted.

The diffuse light guide part 123B includes the space HLB with a shape different from that of the diffuse light guide part 123 in the first embodiment.

More specifically, the plane connecting the center of the back surface display part 121 in the first direction and the center of the collector 122B in the first direction is not parallel to the second direction. In other words, the distance between the light source 150 and the collector 122B in the present embodiment is shorter than the distance between the light source 150 and the collector 122 in the first embodiment.

With such a configuration, the diffuse light guide part 123B can also guide the detection light LF that enters from the collector 122 with good efficiency, can make the brightness of the main surface 125 and the secondary surfaces 126 substantially uniform and can reduce unevenness.

Further, since the brightness of the main surface 125 on the back surface display part 121 and the brightness of the secondary surfaces 126 on the side surface display parts 124 can be made substantially uniform and unevenness can be reduced, the open or closed state of the door can be reliably visually recognized. Therefore, the visibility of the sensor 10B (the door switch) is improved.

As a result, the main surface 125 on the back surface display part 121 and the secondary surfaces 126 on the side surface display parts 124 can display the state of the detection light LF obtained from the opposite state of the door switch. In addition, since the light source 150 is a light emitting diode (LED), the space for disposing the light source 150 can be reduced, and the sensor 10B (the door switch) can be made compact.

In each of the embodiments described above, the shape and formation position of each structure have been limitedly described. However, the disclosure is not limited to the above structures and may have any configuration if it can make the brightness of the main surface 125 on the back surface display part 121 and the brightness of the secondary surfaces 126 on the side surface display parts 124 substantially uniform and can reduce unevenness.

With this configuration, the detection light according to the detection signal received by the sensor from the actuator or according to the state of the sensor can be efficiently guided to the back surface display part of the sensor by the diffuse light guide part, and a predetermined area can be illuminated. The visibility of display parts regarding the opposite state of the door switch is improved. Therefore, an operator can confirm the state of the sensor even from the back surface of the sensor.

In addition, on the back surface display part of the sensor in the door switch, secondary surfaces extending toward a side surface side of the sensor are formed on both sides of the main surface in a longitudinal direction.

In this configuration, the detection light can also be guided to the side surfaces of the sensor, thereby further improving the visibility. Therefore, an operator can confirm the state of the sensor easily.

Further, the diffuse light guide part of the sensor in the door switch is in a bilateral-symmetrical shape in the longitudinal direction of the main surface.

In this configuration, the detection light is uniformly guided and is uniformly emitted to the back surface display part and the side surface display parts in contact with the diffuse light guide part.

In addition, in the door switch, the cross-sectional area of the diffuse light guide part parallel to the back surface display part is larger than the cross-sectional area of the collector parallel to the back surface display part.

In this configuration, the detection light collected by the collector is diffused by the diffuse light guide part, and wider areas of the back surface display part and the side surface display parts emit light. Therefore, visibility is further improved.

In addition, it is preferable that the light source part in the door switch is a light emitting diode. In addition, the light source part is installed so that a light emitting surface is opposite to the collector.

With this configuration, the light source part can be made smaller, and thus the sensor can be made compact. In addition, the space for disposing the light source part and the collector can be reduced, and the sensor can be made compact. Further, when a part of the collector is formed of a material having a low light transmittance, leakage of the detection light can be reduced.

In addition, the diffuse light guide part in the door switch is made of a resin.

In this configuration, the detection light can be efficiently guided by the diffuse light guide part. Moreover, manufacture of the diffuse light guide part is easy.

In addition, the back surface display part in the door switch is made of a resin.

In this configuration, light can be uniformly emitted to the back surface display part. In addition, manufacture of the back surface display part is easy.

According to the disclosure, the visibility of the compact door switch having the light emitting function can be improved.

Further, the structure of the above-described door switch is merely an example, and the structure of each embodiment may be combined if the configuration can obtain the same effects.

What is claimed is:

1. A door switch comprising an actuator and a sensor, wherein
   the door switch is installed so that when a door is closed, a front surface of the sensor and an opposite surface of the actuator are in contact with or close to each other, and
   when the door is open, the font surface of the sensor and the opposite surface of the actuator are separated from each other,
   wherein the sensor further comprises:
   a light source part for emitting a detection light according to a reception state of a detection signal outputted from the actuator or according to a state of the sensor;
   a collector for collecting the detection light;
   a diffuse light guide part formed to be connected to the collector and for diffusing and emitting the detection light collected by the collector; and
   a back surface display part formed on a back surface side of the sensor to be in contact with the diffuse light guide part and having a main surface for emitting the detection light emitted from the diffuse light guide part.

2. The door switch according to claim 1, wherein on the back surface display part, secondary surfaces extending toward a side surface side of the sensor are formed on both sides of the main surface in a longitudinal direction.

3. The door switch according to claim 1, wherein the diffuse light guide part is in a bilateral-symmetrical shape in a longitudinal direction of the main surface.

4. The door switch according to claim 2, wherein the light source part is a light emitting diode and is installed so that a light emitting surface of the light source part is opposite to the collector.

5. The door switch according to claim 1, wherein the diffuse light guide part is made of a resin.

6. The door switch according to claim 1, wherein the back surface display part is made of a resin.

* * * * *